United States Patent
Chou et al.

(10) Patent No.: US 7,441,925 B2
(45) Date of Patent: Oct. 28, 2008

(54) LIGHT SOURCE MODULE

(75) Inventors: Shen-Hong Chou, Miaoli (TW);
Pang-Hsuan Liu, Taoyuan (TW)

(73) Assignee: AU Optronics Corporation, Hsinchu (TW)

( * ) Notice: Subject to any disclaimer, the term of this patent is extended or adjusted under 35 U.S.C. 154(b) by 137 days.

(21) Appl. No.: 11/302,164

(22) Filed: Dec. 14, 2005

(65) Prior Publication Data

US 2006/0274528 A1 Dec. 7, 2006

(30) Foreign Application Priority Data

Jun. 3, 2005 (TW) .............................. 94118349 A

(51) Int. Cl.
*F21V 29/00* (2006.01)
(52) U.S. Cl. ..................... 362/294; 362/249; 362/800
(58) Field of Classification Search ................ 362/240, 362/247, 249, 294, 373, 800; 361/704, 717, 361/718, 719
See application file for complete search history.

(56) References Cited

U.S. PATENT DOCUMENTS

| | | | |
|---|---|---|---|
| 7,044,620 B2 * | 5/2006 | Van Duyn ................... 362/373 |
| 7,175,329 B1 * | 2/2007 | Chou ........................ 362/294 |
| 7,324,174 B2 * | 1/2008 | Hafuka et al. .............. 362/240 |
| 2001/0043472 A1 * | 11/2001 | Gibboney, Jr. ............. 362/240 |
| 2002/0039290 A1 * | 4/2002 | Lemmens .................... 362/249 |
| 2004/0037077 A1 * | 2/2004 | Showers et al. ............. 362/249 |
| 2005/0259424 A1 * | 11/2005 | Zampini et al. ............. 362/294 |
| 2005/0265043 A1 * | 12/2005 | Tseng et al. ................ 362/558 |

* cited by examiner

*Primary Examiner*—Y My Quach Lee
(74) *Attorney, Agent, or Firm*—Birch, Stewart, Kolasch & Birch, LLP

(57) ABSTRACT

A method for assembling light emitting diode units and a substrate in a light source module and a structure thereof are provided. The light emitting diode unit is made of a light emitting diode and a carrier. Every light emitting diode has a flanged profile in the bottom to form a leaned plane, and a corresponding hole is formed on the substrate. Hence, when the light emitting diodes are pressed on the surface of a radiator by the substrate to make a closer contact, the light emitting diodes will be able to bear the pressure by the flanged design.

15 Claims, 6 Drawing Sheets

LIGHT SOURCE MODULE

FIELD OF THE INVENTION

The present invention generally relates to a light source module, and more particularly relates to a method and structure for assembling light emitting diode units and a substrate in a light source module.

DESCRIPTION OF THE PRIOR ART

In the light source module of the prior art, the method and structure for assembling light emitting diode units and a substrate and the step of attaching the assembly structure on a radiator are provided in FIG. 1A to FIG. 1C. Now referring to FIG. 1A, a cross-sectional view of the light source module comprising a plurality of light emitting diode units 12 and a substrate 11 to carry the light emitting diode units 12 is shown. The substrate 11 has a first surface 111 (in the bottom) and a second surface 112 (in the top) corresponding to each other. A plurality of through holes 113 are formed to pass through the substrate 11. The patterned conductive circuit 114 is formed in the first surface 111 of the substrate 11.

Still referring to FIG. 1A, each light emitting diode unit 12 comprises a light emitting diode 121 and a carrier 122. A plurality of leads 124 are electrically connected to the light emitting diode 121 and extend out from the sidewalls of the carrier 122.

Referring to FIG. 1B, when the light emitting diode unit 12 is moved and passed through the corresponding through hole 113 from the first surface 111, the light emitting diode 121 passes through the substrate 11 and over the second surface 112. And the exposed lead 124 is leaned on a patterned conductive circuit 114 on the surrounding area of the through hole 113. Then, a solder 13 can be used to bond the lead 124 to the patterned conductive circuit 114 to complete the electrical connection between the light emitting diode unit 12 and the substrate 11 and the structure.

Referring to FIG. 1C, in order to efficiently dissipate the heat generated in the operation of the light emitting diode unit 12, the light emitting diode unit 12 and the substrate 11 which are bonded together can be turned 180 degrees so as to lean the bottom of the carrier 122 of the light emitting diode unit 12 against the thermal pad 14. And the thermal pad 14 is contacted with the surface of the radiator 15. However, when a downward pressure is applied to the substrate 11 along the direction of the arrow to achieve a tighter contact between the light emitting diode units 12 and the substrate 11 and increase the efficiency of the heat dissipation, the substrate 11 transfers the downward pressure to the lead 124 of the light emitting diode units 12 which bends the lead and damages the patterned conductive circuit 114.

SUMMARY OF THE INVENTION

According to the drawbacks described above, the structure for assembling the light emitting diode unit and the substrate cannot be closely connected to the radiator. An assembling method and structure of the light emitting diode unit and the substrate are provided herein. The purpose is to let the light emitting diode units closely attached on the radiator and the light emitting diode unit wouldn't be damage.

According to the purpose described above, an assembling method and structure of a light source module including light emitting diode units and a substrate are provided. The bottom of a carrier of a light emitting diode unit for carrying a light emitting diode has a fixed portion with a leaned plane. A through hole is formed in a substrate, and the diameter thereof is larger than the diameter of the light emitting diode but smaller than that of the fixed portion. Therefore, when the light emitting diode is attached on the radiator, the pressure from the substrate would render the light emitting diode unit and the substrate contacting tightly and increase the efficiency of the heat dissipation.

BRIEF DESCRIPTION OF THE DRAWINGS

The accompany drawings incorporated in and forming a part of the specification illustrate several aspects of the present invention, and together with the description serve to explain the principles of the invention. In the drawings.

DESCRIPTION OF THE PREFERRED EMBODIMENT

The following is the detailed description of the present invention, which describes the light source module of the invention, but the detailed structure and the operating theory are not discussed. The portions relating to the conventional techniques are briefly described, and the parts of the drawings are not proportionally drafted. While embodiments are discussed, it is not intended to limit the scope of the present invention. Except expressly restricting the amount of the components, it is appreciated that the quantity of the disclosed components may be greater than that of disclosed.

One of the preferred embodiments of the present invention provides an assembling method and structure of a light source module including light emitting diode units and a substrate and the assembly structure can closely attached on a radiator. Now referring to FIG. 2A, a cross-sectional view is shown. The light source module comprises a plurality of light emitting diode units and a substrate used to carry the light emitting diode units. In the present embodiment, the substrate 21 comprises a printed circuit board or any other multi-layer board. The substrate 21 has a first surface 211 (on the bottom) and a second surface 212 (on the top) corresponding to each. other. And a plurality of through holes are formed in the substrate 21 and are corresponding to the position of the light emitting diode units. Beside, a patterned conductive circuit 214 which is formed by a copper layer or other conductive layer is exposed on the first surface 211 of the substrate 21.

Figure 1A:
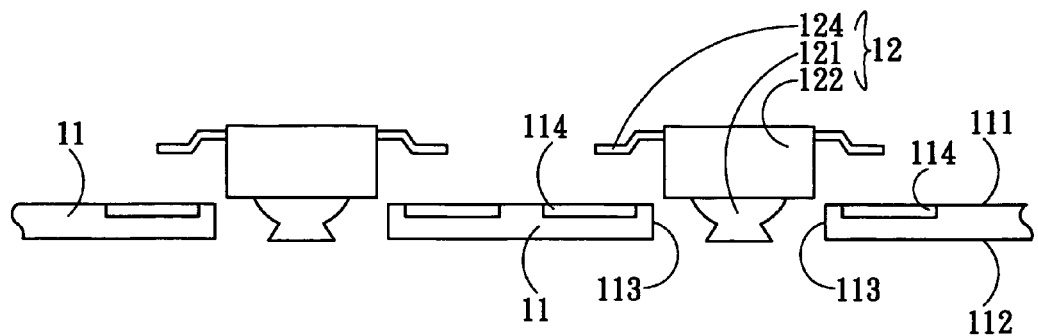
FIGS. 1A-1C show the conventional steps of assembling light emitting diode units to the substrate and a radiator.
Figure 1B:
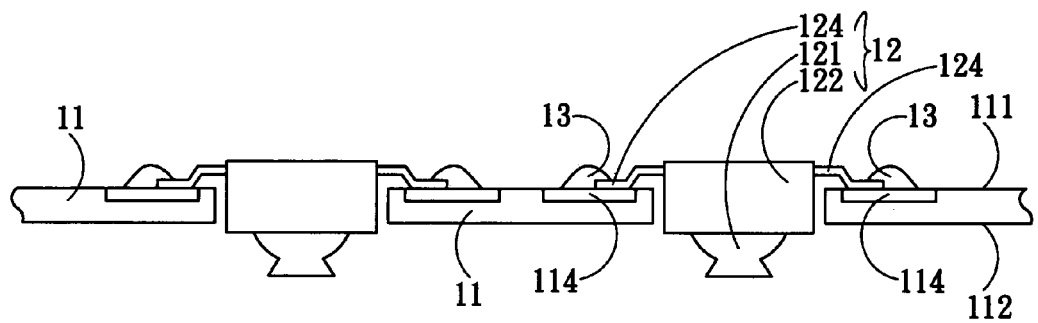
Figure 1C:
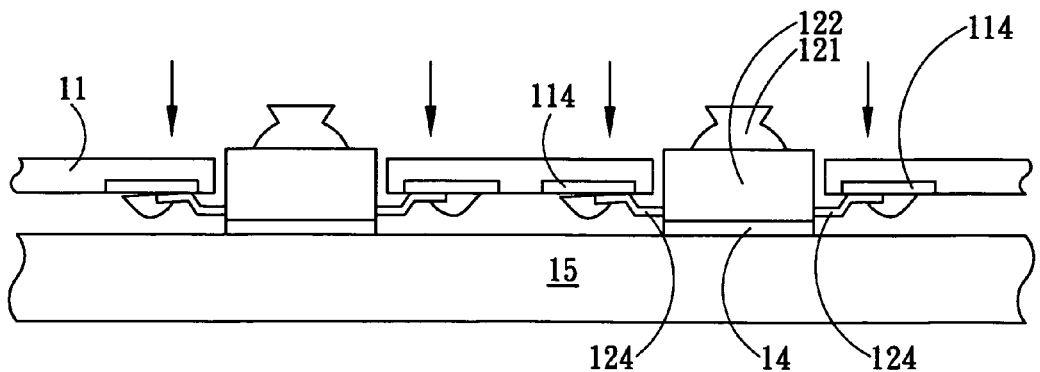
Figure 2A:
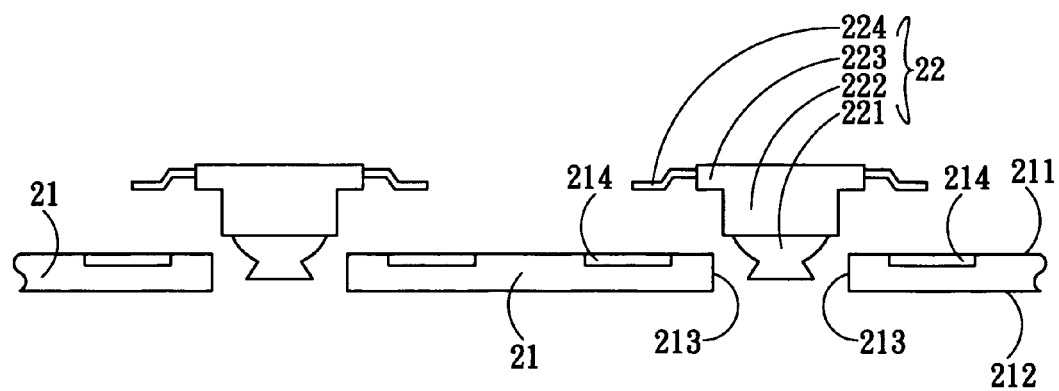
FIGS. 2A-2C show the steps of the preferred embodiment of the present invention for assembling light emitting diode units to a substrate and a radiator.

Still referring to FIG. 2A, the light emitting diode unit 22 comprises a light emitting diode 221 and a carrier 222. Wherein the diameter of the light emitting diode 221 is smaller than the diameter of the first through hole 213. However, the bottom of the carrier 222 extends to form a fixed portion, which has a larger diameter than the diameter of the first through hole 213. A plurality of leads 224 electrically connecting to the light emitting diode 221 extend from two sides of fixed portion 223.

Figure 2B:
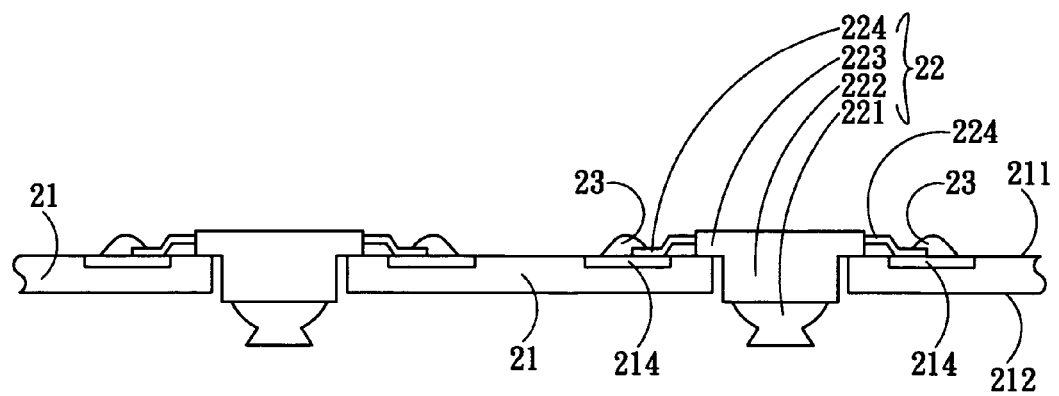

Referring to FIG. 2B, when the light emitting diode units 22 are moved is going through the corresponding first surface 211 of the first through hole 213, the light emitting diode 221 can pass through the first through hole 213 and exposed on the second surface 212 of the substrate 21. The fixed portion 223 is on the first surface 211 and the portion close to the first through hole 213 cannot be passed through. Solders 23 are used to bond the leads 224 to the patterned conductive circuit 214 to complete the electrical connection between the light emitting diode unit 22 and the substrate 21 of the assembly structure.

Figure 2C:
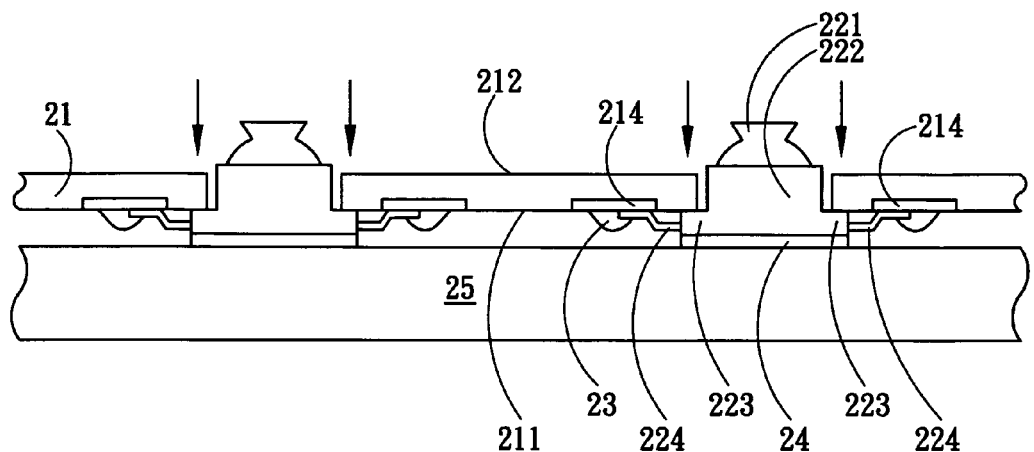

Referring to FIG. 2C, the heat generated in the operation of the light emitting diode 221 can be dissipated by turning the light emitting diode unit 22 and the substrate 21 180 degrees and connecting with a radiator 25 via the connection between a plurality of thermal pads 24 and the bottom of the carrier 222. The carrier 222 provided in the present invention includes a fixed portion 223 and the diameter is larger than the diameter of the first through hole 213. Therefore, the downward pressure applied along the direction of the arrow results in a tight contact/connection between the light emitting diode unit 22 and the radiator 25 and increases the efficiency of the heat dissipation. Therefore, the deformation of the lead of the carrier in the light emitting diode unit of the prior art when a downward pressure is applied and the problem of the peeling of the patterned conductive circuit can be avoided.

Figure 2D:
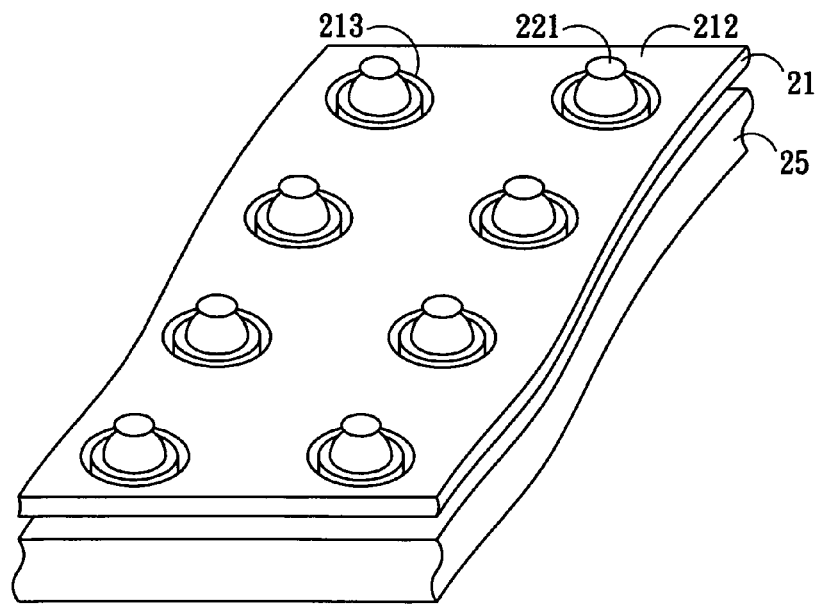
FIG. 2D is a 3-Dimensional view illustrating the light source module in the preferred embodiment of the present invention.
Figure 2E:
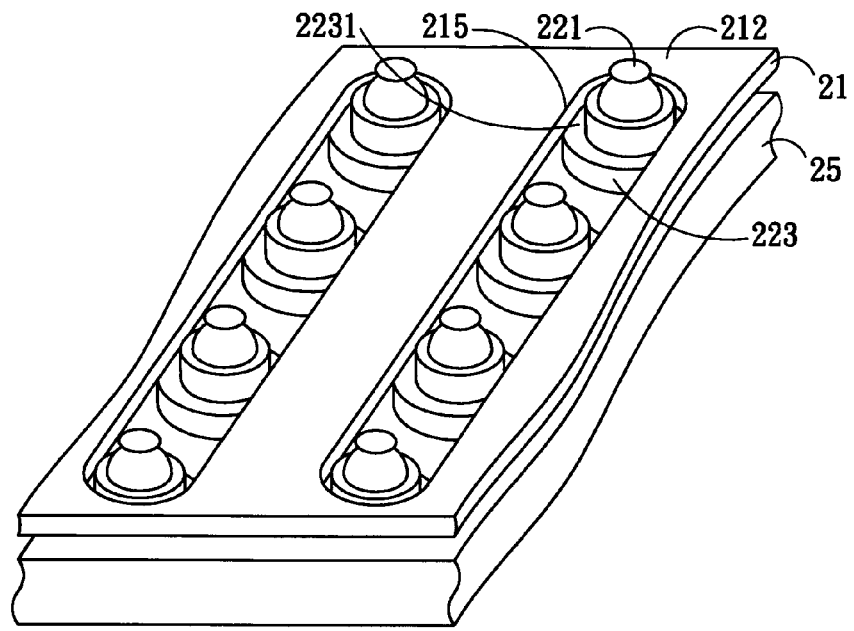
FIG. 2E is a 3-Dimensional view illustrating an assembly structure of a substrate with through trenches and light emitting diode units.

A 3-Dimensional view of a light source module of the invention is shown in Fig. 2D, wherein each light emitting diode 221 passes through the corresponding through hole 213 and exposed on the second surface 212 of the substrate 21. In other embodiments of the present invention, the substrate has through trenches corresponding to a plurality of light emitting diode units as shown in FIG. 2E. The width of the through trench 215 is larger than the diameter of the light emitting diode 221 but smaller than the diameter of the fixed portion 223. Therefore, a plurality of the light emitting diodes 221 pass through the through trench 215 and are exposed on the second surface 212 of the substrate 21. The fixed portion of each light emitting diode unit has a leaned plane 2231 against the surrounding area of the through trench 215 of the first surface of the substrate 21.

Figure 2F:
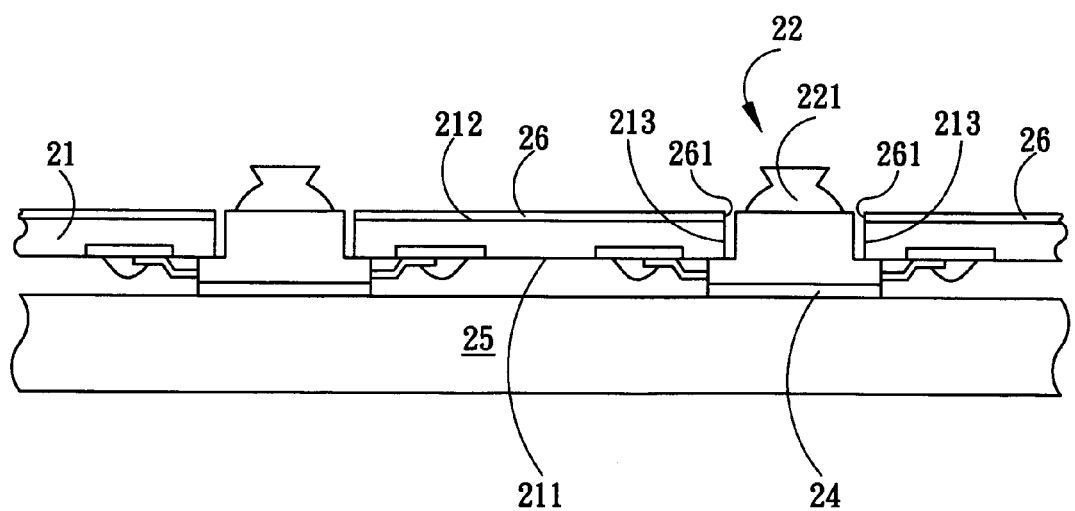
FIGS. 2F and 2G are cross-sectional drawings illustrating a reflective sheet formed on the light source module according to the preferred embodiment of the present invention.
Figure 2G:
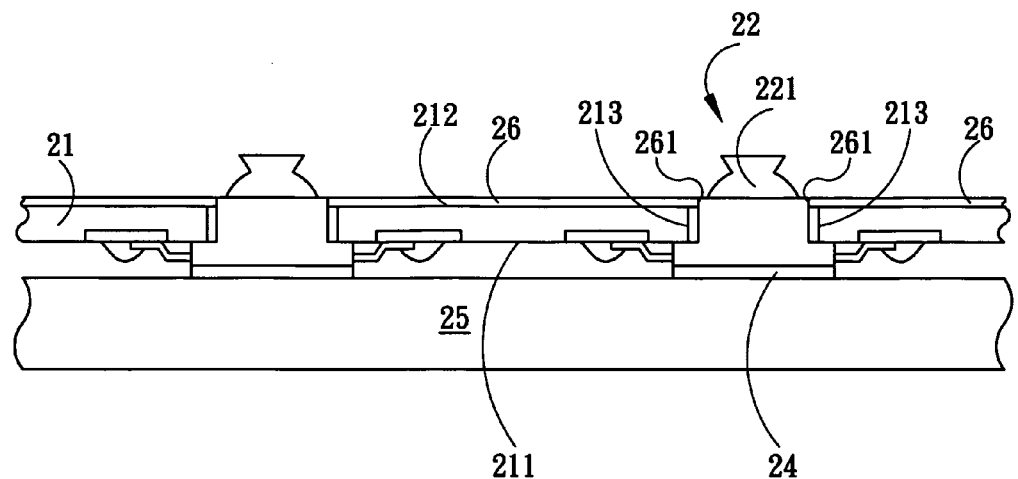

Furthermore, referring to FIG. 2F, a reflective component can be added on the substrate 21 depending on the properties of the light emitting diode unit 22 or the need of the light source module in the present invention. For example, if the light emitting diode 221 is a side emitting light emitting diode 22, a reflective sheet 26 (or a reflective surface) can be attached/formed on the second surface 212 of the substrate 21 and a plurality of second through holes 261 are formed in the positions corresponding to the first through hole 213 in the reflective sheet 26. In addition, the diameter of the second through hole 261 is larger than the diameter of the light emitting diode as shown in FIG. 2F. The light emitting diode 221 directly passes through the second through hole 261 and extends out the reflective sheet 26. Alternatively, in other embodiments of the present invention, second through holes having a diameter, which is equal to the diameter of the carrier and smaller than the diameter of the first through hole 213 ,can be formed in the reflective sheet 26. As shown in FIG. 2G, the reflective sheet 26 is close to the light emitting diode and the loss of light can be avoided. Thus the illumination output will be more efficient.

Figure 2H:
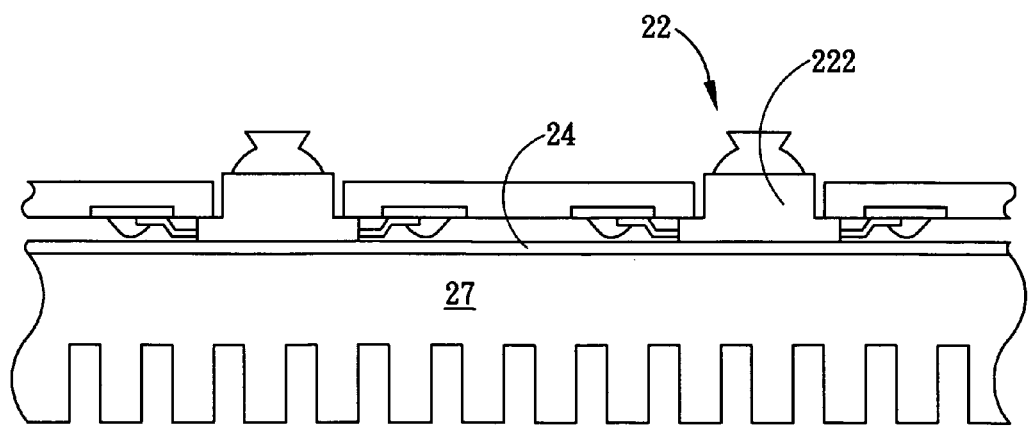
FIG. 2H is a cross-sectional drawing illustrating a heat sink attaching on a light source module according to the preferred embodiment of the present invention.

Besides, in other embodiments of the present invention, the radiator can be chosen from a heat dissipation sheet or a heat sink as shown in FIG. 2H to increase the effect of the heat dissipation. The thermal pad 24 disposed between the bottom of the carrier 222 and the heat sink 27 can be a whole piece as shown in FIG. 2H.

Figure 2I:
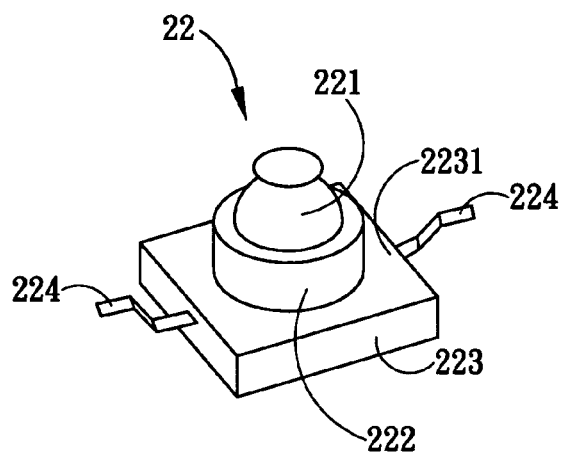
FIG. 2I-2J are the drawings illustrating two embodiments of a fixed portion of a light emitting diode unit in the present invention.
Figure 2J:
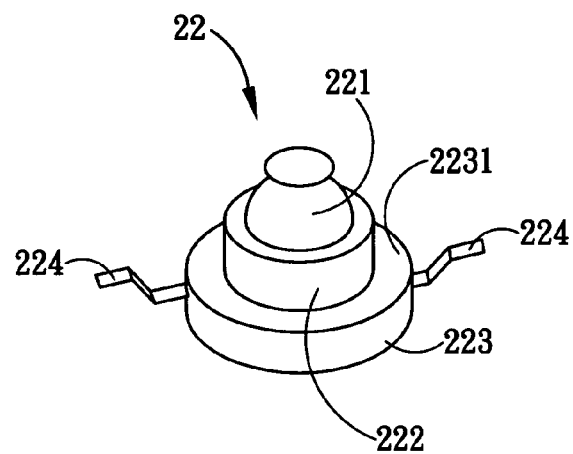

Referring to FIG. 2I and FIG. 2J, two embodiments of the light emitting diode units 22 of the present invention are shown. Each fixed portion 223 is the extension of the bottom of the carrier 222 and has a leaned plane 2231. When the light emitting diode 221 and the carrier 222 pass through the first through hole from the top of the substrate, the fixed portion having a diameter larger than the through hole can lean against the first through hole by the leaned plane and the bonding of the lead 224 and the patterned conductive circuit can be performed successfully. Besides, when the assembly structure of the light emitting diode units 22 and the substrate uses the thermal pad to lean against the surface of the radiator, the pressure on the light emitting diode from the substrate cannot be transferred to the lead 224, which is bonded with the patterned conductive circuit. The shape of the fixed portion of the light emitting diode unit 22 provided in the present invention, as shown in FIG. 2I and FIG. 2J, is a cube or a cylinder and can be formed with a leaned plane having a larger diameter than the diameter of the through hole to achieve a similar leaned effect.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A light source module, comprising:
    a substrate having a first through hole;
    a light emitting diode unit having a carrier and a light emitting diode on the carrier;
    a radiator connected to a bottom of the carrier and including a heat dissipation sheet; and
    a thermal pad disposed between the carrier and the radiator, wherein a diameter of a fixed portion of the carrier is larger than that of the first through hole so that when the carrier of the light emitting diode passes through the first through hole, the fixed portion leans against a first surface of the substrate, and wherein the light emitting diode is completely exposed on a surface of the substrate such that no light emitted from the light emitting diode is blocked along the surface of the substrate.

2. The light source module of claim 1, wherein the carrier includes a lead electrically connected to the light emitting diode, and wherein the carrier includes another portion other than the fixed portion, said another portion completely lying in the first through hole.

3. The light source module of claim 1, wherein the substrate is a printed circuit board.

4. The light source module of claim 1, further comprising a reflective sheet disposed on a second surface of the substrate.

5. The light source module of claim 4, wherein the reflective sheet has a second through hole corresponding to the first through hole so that the light emitting diode passes through the second through hole and extends from the reflective sheet.

6. The light source module of claim 5, wherein a diameter of the second through hole is equal to a diameter of the carrier such that a side of the carrier is invisible from atop the surface of the substrate.

7. A light source module, comprising:
a substrate having at least one through trench, a first surface and a second surface opposite to the first surface; and
a plurality of light emitting diode units corresponding to the through trench, wherein each of the plurality of light emitting diode units comprises a carrier and a light emitting diode on the carrier, the carrier has a fixed portion having a diameter larger than the width of the through trench, and the light emitting diode unit passes through the through trench from the first surface of the substrate and is exposed on the second surface so that the fixed portion leans against the surrounding area of the through trench on the first surface.

8. The light source module of claim 7, wherein the carrier includes a lead electrically connected to the light emitting diode.

9. The light source module of claim 8, wherein the lead is electrically connected to one or more conductive wires.

10. The light source module of claim 7, further comprising a radiator connected to a bottom of the carrier.

11. The light source module of claim 10, wherein the radiator has a heat dissipation sheet.

12. The light source module of claim 10, further comprising a thermal pad disposed between the carrier and the radiator.

13. The light source module of claim 7, further comprising a reflective sheet disposed on the second surface of the substrate.

14. The light source module of claim 13, wherein the reflective sheet having a plurality of through holes corresponding to the light emitting diode unit such that the plurality of light emitting diodes pass through the through holes and are exposed on the reflective sheet.

15. The light source module of claim 7, wherein the substrate is a printed circuit board.

\* \* \* \* \*